(12) United States Patent
Hunter et al.

(10) Patent No.: US 8,519,595 B2
(45) Date of Patent: Aug. 27, 2013

(54) MEMS BASED PYROELECTRIC THERMAL ENERGY HARVESTER

(75) Inventors: Scott R. Hunter, Oak Ridge, TN (US); Panagiotis G. Datskos, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 491 days.

(21) Appl. No.: 12/874,407

(22) Filed: Sep. 2, 2010

(65) Prior Publication Data
US 2012/0056504 A1  Mar. 8, 2012

(51) Int. Cl.
*H02N 10/00* (2006.01)

(52) U.S. Cl.
USPC ............................ 310/305; 310/307; 322/2 R

(58) Field of Classification Search
USPC ......... 310/306, 307, 339; 322/2 R; 318/177, 318/117; 136/213; 60/527, 528, 529
See application file for complete search history.

(56) References Cited

U.S. PATENT DOCUMENTS

| | | | |
|---|---|---|---|
| 3,610,970 A | 10/1971 | Skinner | |
| 3,971,938 A | 7/1976 | O'Hare | |
| 4,220,906 A | 9/1980 | Drummond | |
| 4,441,023 A | 4/1984 | Doctor et al. | |
| 4,546,054 A | 10/1985 | Carr et al. | |
| 4,620,262 A | 10/1986 | Olsen | |
| 4,647,836 A | 3/1987 | Olsen | |
| 5,376,184 A | 12/1994 | Aspden | |
| 5,619,177 A * | 4/1997 | Johnson et al. | 337/140 |
| 5,644,184 A | 7/1997 | Kucherov | |
| 6,211,598 B1 * | 4/2001 | Dhuler et al. | 310/307 |
| 6,528,898 B1 | 3/2003 | Ikura et al. | |
| 6,657,358 B2 | 12/2003 | Perner | |
| 6,698,201 B1 * | 3/2004 | Sarkar et al. | 60/527 |
| 6,799,282 B2 | 9/2004 | Maeda et al. | |
| 6,936,994 B1 | 8/2005 | Gimlan | |
| 7,034,411 B2 | 4/2006 | Chen et al. | |
| 7,112,911 B2 | 9/2006 | Tanaka et al. | |
| 7,235,914 B2 * | 6/2007 | Richards et al. | 310/328 |
| 7,323,506 B2 | 1/2008 | Kouchachvili et al. | |
| 7,397,169 B2 * | 7/2008 | Nersessian et al. | 310/339 |

(Continued)

FOREIGN PATENT DOCUMENTS
JP  2002-144297  5/2002

OTHER PUBLICATIONS

Sebald, G. et al., "On thermoelectric and pyroelectric energy harvesting," Smart Mater. Struct., 18, 125006, Dec. 2009 (7 pages).

(Continued)

*Primary Examiner* — Tran Nguyen
*Assistant Examiner* — Thomas Truong
(74) *Attorney, Agent, or Firm* — Pauley Petersen & Erickson

(57) ABSTRACT

A pyroelectric thermal energy harvesting apparatus for generating an electric current includes a cantilevered layered pyroelectric capacitor extending between a first surface and a second surface, where the first surface includes a temperature difference from the second surface. The layered pyroelectric capacitor includes a conductive, bimetal top electrode layer, an intermediate pyroelectric dielectric layer and a conductive bottom electrode layer. In addition, a pair of proof masses is affixed at a distal end of the layered pyroelectric capacitor to face the first surface and the second surface, wherein the proof masses oscillate between the first surface and the second surface such that a pyroelectric current is generated in the pyroelectric capacitor due to temperature cycling when the proof masses alternately contact the first surface and the second surface.

22 Claims, 7 Drawing Sheets

(56) References Cited

U.S. PATENT DOCUMENTS

| | | | |
|---|---|---|---|
| 7,800,278 B2* | 9/2010 | Ujihara et al. | 310/306 |
| 2010/0011768 A1 | 1/2010 | Hacsi | |
| 2011/0169372 A1* | 7/2011 | Lim | 310/307 |
| 2012/0049694 A1* | 3/2012 | van Schaijk et al. | 310/339 |

OTHER PUBLICATIONS

Okuyama, M. et al., "Simonolithic integrated pyroelectric infrared sensor made of PbTiO3 thin films", Int'l J of Infrared and Millimeter Waves, vol. 6, No. 1, Jan. 1985 (Abstract).

Shenck, N. et al., "Energy Scavenging with Shoe-Mounted Piezoelectrics," IEEE Micro, vol. 21, No. 3, May/Jun. 2001, pp. 30-42 (Abstract).

Paradiso, J. et al., "Energy Scavenging for Mobile and Wireless Electronics," IEEE Pervasive Computing, vol. 4, No. 1, Jan.-Mar. 2005, pp. 18-27 (Abstract).

Chuang, Y. et al., "Thermoelectric automotive waste heat energy recovery using maximum power point tracking," Energy Conversion and Mgmt, vol. 50, Issue 6, Jun. 2009, pp. 1506-1512 (Abstract).

Cuadras, A. et al., "Thermal energy harvesting through pyroelectricity," Sensors and Actuators A: Physical, vol. 158, Issue 1, Mar. 2010, pp. 132-139 (Abstract).

* cited by examiner $\frac{dT}{dt} = 0$ $\frac{dT}{dt} > 0$

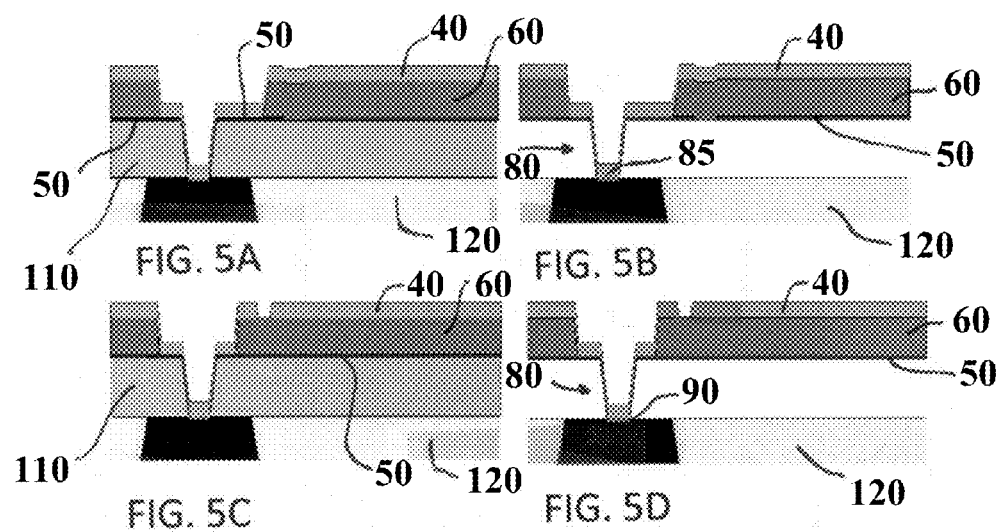
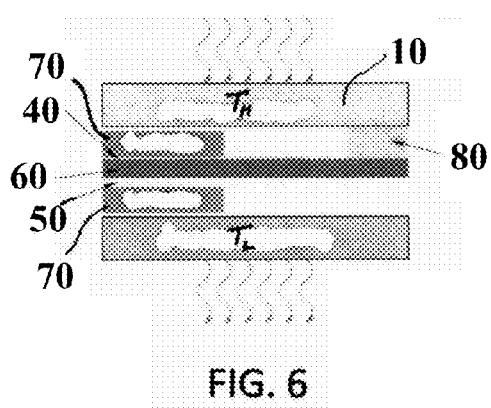

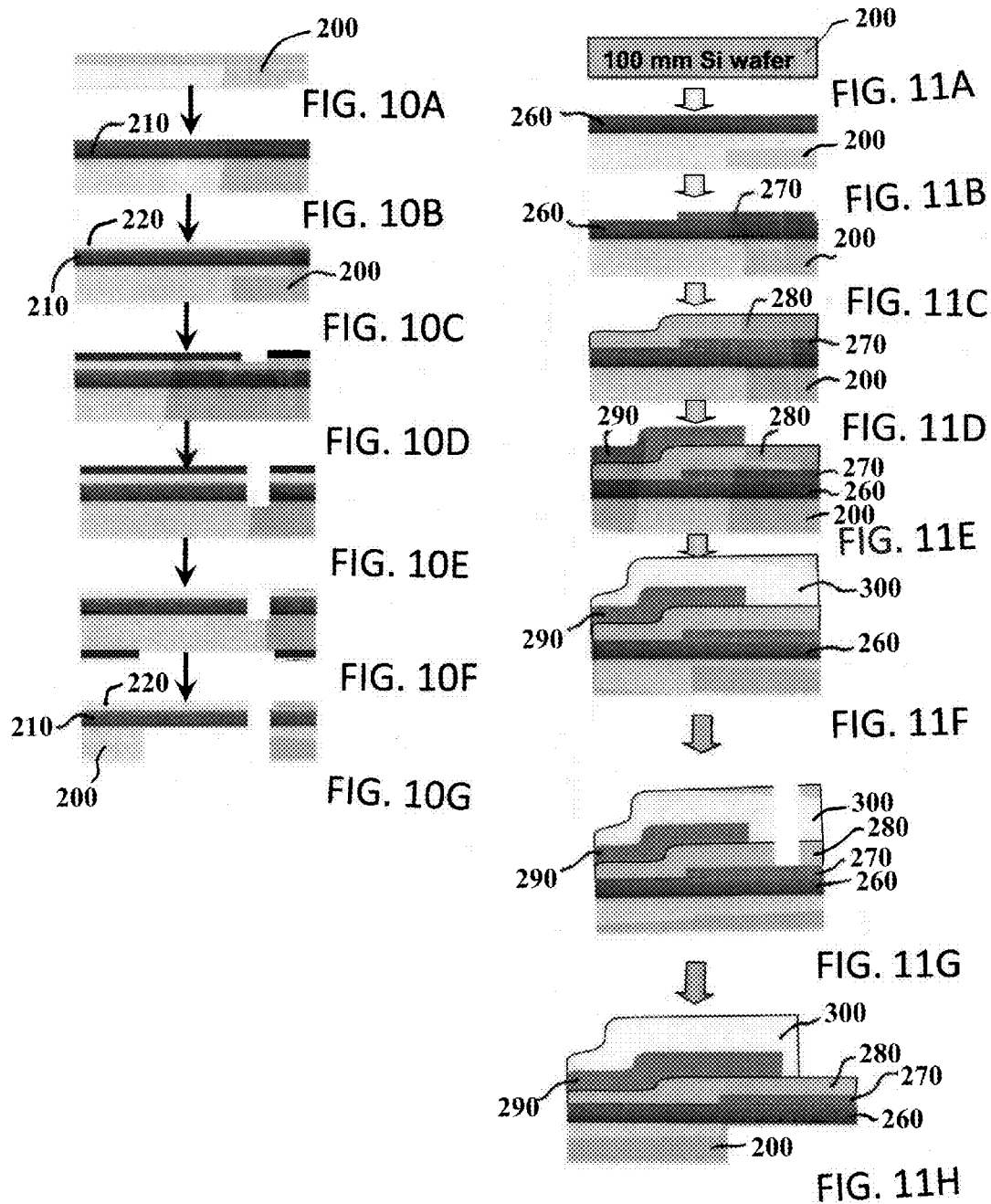

US 8,519,595 B2

MEMS BASED PYROELECTRIC THERMAL ENERGY HARVESTER

GOVERNMENT RIGHTS

This invention was made with government support under Contract No. DE-AC05-00OR22725 awarded by the U.S. Department of Energy. The government has certain rights in the invention.

FIELD OF THE INVENTION

The present invention relates to a pyroelectric thermal energy harvesting device.

BACKGROUND OF THE INVENTION

Industry, worldwide, discharges over $100 \times 10^{12}$ joules (TJ) annually of low-grade waste heat (10° C. to 250° C.) from electric power stations, pulp and paper mills, steel and other metal foundries, glass manufacturers and petrochemical plants. A technology to recover or convert this low-grade waste heat to usable electricity could save industrial sectors tens of millions of dollars annually, through increased process efficiencies and reduced fuel costs, while substantially reducing greenhouse gas emissions. Other opportunities also exist for active cooling and electrical power generation for sensor systems on much smaller scales, such as on-chip active heat sinks, concentrated photovoltaic solar cells, and in standalone computers systems and computer data processing centers.

The useful work content of all thermal engines is thermodynamically limited by the Carnot efficiency, $\eta_{Carnot}$:

$$\eta_{Carnot} = 1 - T_L/T_H \qquad (1)$$

where $T_H$ is the temperature of the heat source and $T_L$ is the temperature of the heat sink.

Thermal energy gradient power generators convert heat ($Q_{in}$) into electrical energy ($W_{out}$) with efficiency:

$$\eta = W_{out}/Q_{in} = (W_E - W_P)/(C_v \Delta T + Q_{Int} + Q_{Leak}) \qquad (2)$$

where $W_E$ is the generated electrical energy, $W_P$ is the energy lost in the temperature cycle, $C_v$ is the heat capacity of the pyroelectric device, $Q_{Int}$ are the intrinsic heat losses in the thermal cycle and $Q_{Leak}$ are the heat leakages between the hot and cold sources.

Presently contemplated thermal to electrical energy conversion techniques (thermoelectric, piezoelectric and pyroelectric) all suffer from low energy conversion efficiencies, limited partly by the Carnot efficiency, but also by the inherent limitations of the conversion technologies themselves. Pyroelectric converters remain relatively unexplored, as early attempts to model and fabricate converters based on pyroelectric operating principles gave uneconomically low conversion efficiencies (0.1-2%). Other modeling studies were much more encouraging however, with overall predicted energy efficiencies ranging from 10 to 40% and with Carnot efficiencies in the range 50-80% or higher. In contrast, thermoelectric generators have maximum Carnot efficiencies around 14-17% and overall maximum efficiencies around 5%.

Traditional quasi-thermal pyroelectric energy generators rely on the property that the spontaneous polarization (and hence dielectric constant) of certain materials is temperature dependent. Cycling the material's temperature induces an alternating current in an external circuit when the pyroelectric material is made the dielectric in a capacitor. This property is shown schematically in FIGS. 1A-1C, where the intrinsic dipole moment of the pyroelectric material is made part of a capacitor and an ammeter is connected between the two capacitor electrodes. As shown in FIG. 1B, at constant temperature, no current flows in the circuit. When the capacitor temperature is increased, as shown in FIG. 1C, the polarization $P_S$ decreases, effectively reducing the capacitor's dielectric constant, and causing a current to flow in the external circuit to compensate for the decrease in the bound charge in the capacitor. This property can be used to generate electricity where the electrical current and energy conversion efficiency depends on the rate of change, and on the magnitude of the temperature change in the capacitor.

The quasi-isothermal cycle used in the simple prior art energy harvester shown in FIGS. 1A-1C is very inefficient and, as a result, produces very little power. However, by allowing large temperature swings across the device, and by placing alternating voltages on the electrodes of the pyroelectric capacitor as indicated in FIG. 2, much higher efficiencies and output powers are achievable. This cycle is known as an Ericson thermal energy generation cycle and has been used in previous attempts to generate electricity from thermal energy gradients. Other thermal cycles include Rankin and Stirling cycles and are used in steam power plants, internal combustion engines and refrigerators.

The cycle starts at (a) in FIG. 2 with the pyroelectric capacitor at low temperature $T_L$ and the ferroelectric capacitor charged at high voltage $V_2$. As the temperature increases to $T_H$ at a constant applied voltage (b), charge is forced to flow in the external circuit charging the storage capacitor, such as in an embodiment shown in FIG. 8. The applied voltage is then reduced to $V_1$ at (c) and the temperature of the pyroelectric capacitor decreased to $T_L$ again (d), producing another, opposite sign, current flow in the external circuit.

The pyroelectric current $I_p$ produced during the cycle shown in FIG. 2 is:

$$I_P = A_f(dP_s/dt) = A_f p(dT/dt) \qquad (3)$$

where $A_f$ is the surface area of the pyroelectric thin film capacitor, $P_S$ (C/m$^2$) is the pyroelectric thin film polarization, such as in the embodiment shown in FIG. 1, T is the pyroelectric capacitor temperature and p is the pyroelectric coefficient in C/m$^2$K. The net output power $N_p$ from the pyroelectric capacitor is:

$$N_P = V_{appl} I_P = V_{appl} p A_f (dT/dt) \qquad (4)$$

where $V_{appl}$ is the external applied voltage across the pyroelectric capacitor, such as in an embodiment shown in FIG. 3. The cumulative pyroelectric conversion output work $W_{out}$ from the cycle is as follows:

$$W_{out} = \oint V_{appl} dq = \int N_p dt = \int V_{appl} p A_f (dT/dt) dt \qquad (5)$$

Equation 5 is shown schematically in FIG. 2 where $W_{out}$ is the integral over the area within the figure: the greater the change in applied voltage across the pyroelectric capacitor and the wider the temperature swing, the larger the amount of heat energy converted to useful electrical energy. Equations 3 and 5 also show that the magnitude of the current and electrical energy generated by this circuit is also dependent on the magnitude of the pyroelectric coefficient p, the size of the capacitor (plate area A), and very importantly, on the rate of change in the temperature across the pyroelectric capacitor. Hence the faster the temperature can be cycled back and forth across the device, the more efficient the energy conversion process is and the greater the amount of electrical energy generated.

Prior attempts to use this technique to generate electricity have suffered from low energy conversion efficiencies due to the low operating frequencies (<1 Hz), large power requirements to generate significant temperature cycles ($W_p$ in Equation 1), large thermal mass capacitor systems with relatively low breakdown strengths (i.e. low voltage differences, $V_2-V_1$) and low thermal conductivities (leading to low $\Delta T/\Delta t$) and hence low $\Delta Q/\Delta T$.

SUMMARY OF THE INVENTION

According to preferred embodiments of the invention, a high efficiency, low grade waste heat energy converter is desired to actively cool electronic devices, concentrated photovoltaic solar cells, computers and larger waste heat producing systems, while generating electricity that can be used to power monitoring sensor systems, or recycled to provide electrical power.

A pyroelectric thermal energy apparatus for generating an electric current according to the invention preferably includes a cantilevered layered pyroelectric capacitor alternately contacting a first surface and a second surface. The first surface preferably includes a higher temperature than the second surface so as to result in a temperature difference between the surfaces.

The layered pyroelectric capacitor includes a proximal end anchored to either the first surface or the second surface by a low thermal conductivity anchor, and an opposite distal end extending a distance or length away. The layered pyroelectric capacitor includes a conductive, bimetal top electrode layer, an intermediate pyroelectric dielectric layer and a conductive bottom electrode layer.

In addition, a pair of proof masses may be affixed one to each electrode layer at the distal end of the capacitor to face each of the first surface and the second surface. As a result of the described configuration, the proof masses oscillate between the first surface and the second surface, alternately heating and cooling the cantilevered pyroelectric capacitor, such that a pyroelectric current is generated between the top electrode layer and the bottom electrode layer of the capacitor due to the oscillating temperature change in the pyroelectric capacitor. Preferably, the cantilevered capacitor as described, mechanically oscillates at a resonant frequency greater than 1 Hz and more preferably between 10 Hz and 1 kHz.

Desired overall energy conversion efficiencies in the range of 20-30% or greater are sought, and efficiencies up to 80% of the Carnot efficiency limit are obtainable with scaled arrays (up to $10^6$ converter elements). As a result, the subject invention may provide large reductions in waste heat production and subsequent cooling requirements, together with the generation of high quality electrical energy from a wide range of waste heat sources.

BRIEF DESCRIPTION OF THE DRAWINGS

The above-mentioned and other features and objects of this invention will be better understood from the following detailed description taken in conjunction with the drawings wherein:

FIG. 5A shows a schematic view of a top electrode anchor fabrication technique of the cantilevered pyroelectric capacitor with a sacrificial layer intact according to one preferred embodiment of this invention;

FIG. 5B shows a schematic view of a top electrode anchor fabrication technique of the cantilevered pyroelectric capacitor after the sacrificial layer has been etched away according to one preferred embodiment of this invention;

FIG. 5C shows a schematic view of a bottom electrode anchor fabrication technique of the cantilevered pyroelectric capacitor with a sacrificial layer intact according to one preferred embodiment of this invention;

FIG. 5D shows a schematic view of a bottom electrode anchor fabrication technique of the cantilevered pyroelectric capacitor after the sacrificial layer has been etched away according to one preferred embodiment of this invention;

FIG. 6 shows a schematic view of a cantilevered pyroelectric capacitor at a start of an energy conversion cycle according to one preferred embodiment of this invention;

FIG. 10A-10G show schematic side views of a fabrication method for a pyroelectric capacitor according to one preferred embodiment of this invention; and FIG. 11A-11H show schematic side views of a fabrication method for a pyroelectric capacitor according to one preferred embodiment of this invention.

DETAILED DESCRIPTION OF THE INVENTION

Figure 3:
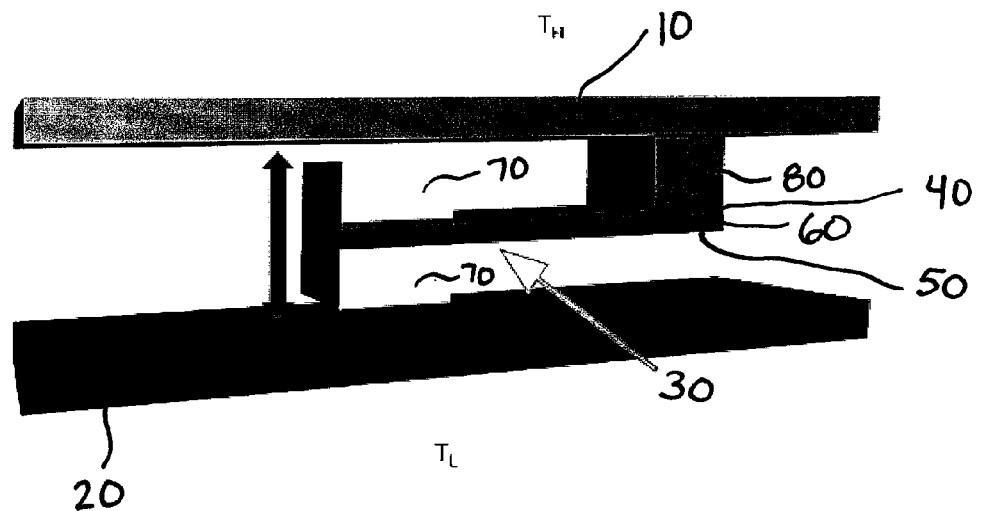
FIG. 3 shows a schematic side view of a pyroelectric energy converter device according to one preferred embodiment of this invention.
Figure 4:
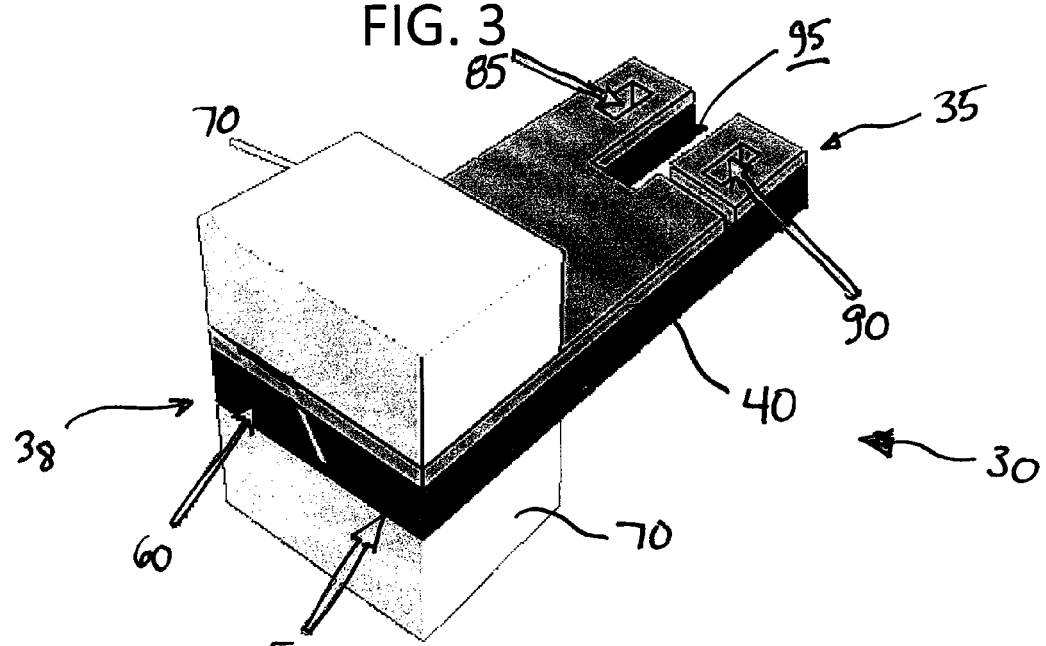
FIG. 4 shows a schematic front view of a pyroelectric energy converter device according to one preferred embodiment of this invention.

FIGS. 3 and 4 show preferred embodiments of the invention. An individual pyroelectric energy scavenging device according to one preferred embodiment of the invention is shown schematically in FIG. 3. The device includes a biomorph cantilevered pyroelectric capacitor structure 30, with dimensions of a few hundred μm to several mm in size. This structure is preferably positioned between a heated first surface 10 at temperature $T_H$ and a cold heat sink second surface 20 at temperature $T_L$.

FIG. 4 shows a detailed schematic of the cantilevered capacitor structure 30 according to one preferred embodiment. The cantilevered structure is preferably fabricated with two metal films, which act as electrodes 40, 50 of the capacitor, and a pyroelectric material dielectric 60, for example, a copolymer of poly-vinylidene fluoride (PVD) or aluminum nitride, which is sandwiched between the two electrodes. Two additional small metal proof masses 70 are preferably located at the end of the cantilever to increase the mechanical mass of the structure and to make good thermal contacts with the hot and cold surfaces. A split anchor 80, 90, such as shown in FIG. 4, also preferably provides the two capacitor electrodes electrical contacts to the external charge extraction and control circuitry.

Specifically, as shown in FIGS. 4 and 6, a pyroelectric thermal energy apparatus for generating an electric current is positioned between a first surface 10 having a first temperature ($T_H$) and a second surface 20 having a second temperature ($T_L$). The first surface 10 and the second surface 20 are preferably spaced apart from each other and include a temperature gradient ($T_H$–$T_L$) between the first surface 10 and the second surface 20. In operation, the first surface 10 is a surface of or near a piece of equipment producing waste heat for scavenging energy in accordance with the invention.

A layered pyroelectric capacitor 30 is preferably disposed between the first surface 10 and the second surface 20. As described, the first surface 10 and the second surface 20 may be parallel surfaces, as shown schematically in the drawings; may be within a partial or complete enclosure, thereby forming a cavity or volume; and/or may comprise two nearby surfaces incident to the piece of equipment generating waste heat. The layered pyroelectric capacitor 30 includes a proximal end 35, a distal end 38 at a distance or length from the proximal end 35, a width, and a thickness. According to one embodiment, lengths may range from approximately 100 μm to approximately 10 mm; widths may range from approximately 50 μm to approximately 5 mm; and thicknesses may range from approximately 1 μm to approximately 1 mm.

As shown in FIGS. 4 and 5, the layered capacitor 30 preferably includes a relatively thick conductive, bimetal top electrode layer 40; a relatively thin conductive bottom electrode layer 50; and a pyroelectric dielectric layer 60 sandwiched between the top electrode layer 40 and the bottom electrode layer 50.

The top electrode layer 40 may comprise the same or different material from the bottom electrode layer 50. The top electrode layer 40 preferably comprises low thermal expansion coefficient metal such as titanium (Ti) to maximize a thermal expansion difference from the high thermal expansion pyroelectric dielectric layer 60. The bottom electrode layer 50 preferably comprises a high thermal expansion metal such as gold (Au) or aluminum (Al) to maximize the cantilever bending response to changes in temperature. According to one embodiment, thicknesses of individual layers may range from approximately 0.5 μm to approximately 1 mm for the pyroelectric dielectric layer 60; approximately 0.1 μm to approximately 100 μm for the top electrode layer 40; and approximately 10 nm to 100 nm for the bottom electrode layer 50.

The layered capacitor 30 is preferably cantilevered from the first surface 10 or second surface 20 through an anchor 80 so that the top bimetal electrode layer 40 faces the first surface 10 and the conductive bottom electrode layer 50 faces the second surface 20. As shown and described in more detail herein, the anchor 80 may include a top electrode anchor 85 and a bottom electrode anchor 90. In a "split" anchor 80 arrangement, the top electrode anchor 85 and the bottom electrode anchor 90 may be split and/or otherwise separated, such as by a space 95 in the layered capacitor 30.

The layered capacitor 30 may preferably further include a pair of proof masses 70 positioned at the distal end 38. As shown in FIGS. 4 and 6, one proof mass 70 is preferably affixed to each electrode layer 40, 50 on opposite sides of the layered capacitor 30 to face either the first surface 10 or the second surface 20. As a result of the described arrangement, the temperature difference between the first surface 10 and the second surface 20 causes the bimetal top electrode 40 to deform when alternately cooled and heated from thermal expansion coefficient mismatch, causing the proof masses 70 to alternately contact the first and second surfaces 10, 20 at the resonant frequency of the layered capacitor such that a pyroelectric current is generated between the top and bottom electrode layers 40, 50, when connected to an external circuit.

The proof masses 70 preferably comprise a highly thermal conductive material to maximize heat transfer from the first surface 10 and the second surface 20. For example, the proof masses 70 may be fabricated from gold (Au), graphene thin film, or a diamond-like thin film surface to maximize this heat transfer.

According to a preferred embodiment of the invention, the layered capacitors 30 are preferably micro- or meso-sized structures wherein the length of the layered capacitor 30 is preferably approximately two to eight or more times the width, and more preferably at least four times as long as wide. Likewise, layered capacitors according to the invention preferably include a thickness less than half of the width. As a result of the preferred geometry, a cantilevered arrangement is provided which enables high frequency movement of the layered capacitor 30 and proof masses 70 between the first surface 10 and the second surface 20.

FIG. 5A-5D show a structure and fabrication technique of the cantilevered capacitor 30 and anchor electrical connections according to one preferred embodiment. FIGS. 5A and C and 5B and D show the structure of the anchors 80 connecting the bimetal top electrode 40 and the capacitor bottom electrode 50 underlying complementary metal-oxide semiconductor (CMOS) control circuitry 120, respectively. According to this embodiment, the bottom electrode 50 is preferably thinner and, more preferably, substantially thinner than the top electrode 40 and does not significantly contribute to the bimaterial bending of the cantilever structure. The bottom electrode 50 preferably provides a good electrically conducting electrode for the pyroelectric capacitor.

The anchors 80 and the remaining cantilever structure are fabricated using microelectromechanical systems (MEMS) fabrication techniques. A sacrificial layer 110 is first deposited directly on top of the CMOS wafer control and energy extraction circuitry 120. The sacrificial layer 110 is etched to expose the CMOS bond pads, such as shown in FIGS. 5A-5D, and the thin bottom sputtered electrode metal is deposited directly on the sacrificial layer 110 on the wafer. The cantilever structures are defined by etching the metal into the required patterns. To fabricate the top electrode anchor 85, a small region of the bottom metal is etched to provide an electrical break with the metal in the anchor. The pyroelectric polymer is then deposited and etched away to define the cantilever structure and also etched away in the anchor hole region, creating the capacitor dielectric layer on the cantilever capacitor structure. The top bimetal layer 40, preferably much thicker than the bottom electrode layer 50, is then deposited on the cantilever area and into the anchor 80, providing an electrical connection for the top electrode to the underlying CMOS circuitry through the anchor and CMOS bond pad. This layer is also etched to define the cantilever structure, and as a final step, the sacrificial layer is also etched to free the cantilever structure.

The bottom electrode anchor 90 is fabricated in a similar manner, except that the bottom metal is not etched away in the anchor region thus giving an electrical connection between the cantilever bottom electrode 50 and the CMOS bond pad, such as shown in FIGS. 5B and D. After the top metal layer 40 has been deposited over the bottom metal 50 in the anchor region, a small region of the top metal is etched away in the bottom electrode anchor 90 region, at the same time as the top metal is etched to define the cantilever structure. This technique gives a good, low electrical resistivity path between the bottom electrode 50 into the anchor 90. The side wall coverage in the anchor region, using just the bottom electrode metal to define the electrical connection, might not be sufficient to give a low resistivity path to the CMOS bond pad without the addition of the low resistivity top metal in the anchor region. The two anchors 85, 90, fabricated in this manner, also possess very similar mechanical properties (e.g., stiffness, load bearing, etc.) and will respond mechanically to changes in heat and mechanical stresses almost identically.

As mentioned above, the top electrode 40 metal film is preferably considerably thicker than the bottom metal electrode 50, and comprises a low thermal expansion metal, for example titanium, while the pyroelectric polymer material 60 has a much higher thermal expansion coefficient (TCE). The metal and polymer films act as bimaterial elements and when heated by a thermal conduction through the anchor, the differential expansion of the bimaterials in the cantilever cause the cantilever, along with the metal proof masses 70, to bend down toward the cold surface. The cantilever bending as a function of change in the structure temperature is dependent upon geometry and thickness of the cantilever structure. The deflection of a microcantilever tip, $\Delta Z$, when the cantilever temperature increases from $T_L$ to $T_H$, is given by:

$$\Delta Z = (3L_B^2/8t_B)(\alpha_P - \alpha_M)(T_H - T_L)K_0 \quad (6)$$

where $L_B$ is the length of the bimaterial section of the cantilever sensor, $\alpha_m$ and $\alpha_P$ are the bimaterial, for example titanium, and pyroelectric polymeric material (e.g. PVD) thermal coefficients of expansion respectively, $t_B$ is the thickness of the high TCE polymer bimaterial, $(T_H - T_L)$ is the differential temperature between the hot and cold surfaces, and the constant $K_0$ is given by the following:

$$K_0 = 8(1+x)/(4+6x+4x^2+nx^3+1/nx) \quad (7)$$

where $x = t_P/t_M$ is the ratio of the substrate to bimaterial thicknesses and $n = E_P/E_M$ is the ratio of the Young's moduli of the substrate and bimaterial. These equations indicate that the microcantilever bending, $\Delta Z$, can be maximized by finding bimaterials with large differences in their thermal expansion coefficients and optimizing the cantilever or beam geometries.

Figure 7:
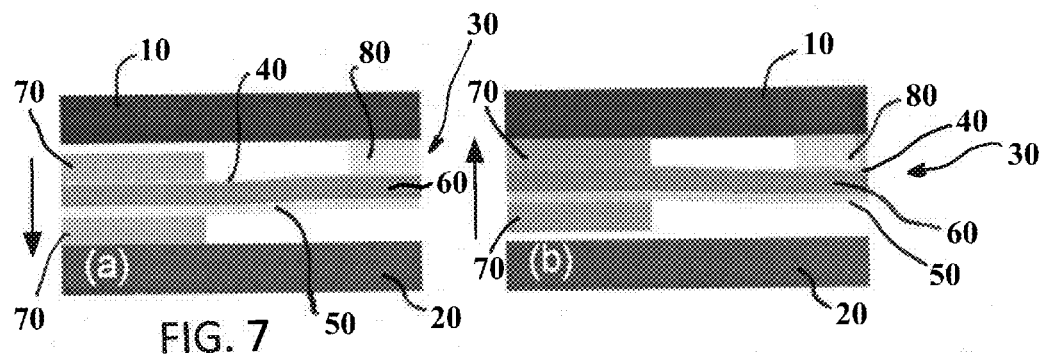
FIG. 7A shows a schematic view of a cantilevered pyroelectric capacitor when the cantilever has been heated and contacts the lower cooled second surface according to one preferred embodiment of this invention.
FIG. 7B shows a schematic view of a cantilevered pyroelectric capacitor when the cantilever has been cooled and contacts the upper heated first surface according to one preferred embodiment of this invention.

The operation of the energy scavenging device can be seen with reference to FIGS. 6 and 7. FIG. 6 shows the cantilevered structure located between the hot and cold surfaces. The cantilever is initially heated due to its connection to the upper heated surface. According to one preferred embodiment, heat is conducted or otherwise transferred through the anchor 80, described above. The heating of the cantilever bimorph structure causes the cantilever to bend down toward the lower cold surface. If the cantilever temperature is high enough, the lower electrode proof mass contacts the lower cold surface (or second surface 20, herein) and immediately thermally shorts to the cold surface, such as shown in FIG. 7A. The temperature of the cantilever and pyroelectric capacitor structure rapidly decreases, causing the structure to bend upwards and move towards the upper electrode at the resonant frequency of the cantilever. The proof mass on the upper electrode will now contact the hot upper surface (or first surface 10, herein) and again thermally short to the surface, rapidly increasing the temperature of the cantilever and pyroelectric capacitor structure, such as shown in FIG. 7B. The rapid heating and cooling of the cantilever structures causes the structure to alternately contact the hot and cold surfaces, preferably connected to an external heat sink, with a frequency dependent on the thermal response time of the structure and the resonant frequency of the cantilever.

As described, a method of generating an electric current from a pyroelectric thermal energy apparatus includes providing a thermal energy to the first surface 10 having the first temperature $(T_H)$ and providing and/or maintaining the second surface 20 at a second temperature $(T_L)$ that is less than the first temperature $(T_H)$. The cantilevered layered capacitor 30 alternately deforms the bimetal top electrode 40 with the temperature gradient between the first temperature $(T_H)$ and the second temperature $(T_L)$, such that the proof masses 70 alternately contact the first surface 10 and the second surface 20 at the resonant frequency of the cantilevered layered capacitor. The change in temperature caused by the alternating contact between hot $(T_H)$ and cold surfaces $(T_L)$ causes a change in the dielectric constant in the pyroelectric dielectric material. This change in the dielectric constant then leads to a change in charge and results in a current in the external circuitry of the cantilevered layered capacitor 30.

According to one preferred embodiment of this invention, the thermal contact and conduction between the top electrode 40 and the first surface 10 and the bottom electrode 50 and the second surface 20 is enhanced to improve heat transfer between surface structures and improve the efficiency of the device. The efficiency and effectiveness of the devices described herein may be further optimized by isolating the layered capacitor 30 within a partially evacuated enclosure.

Figure 1A:
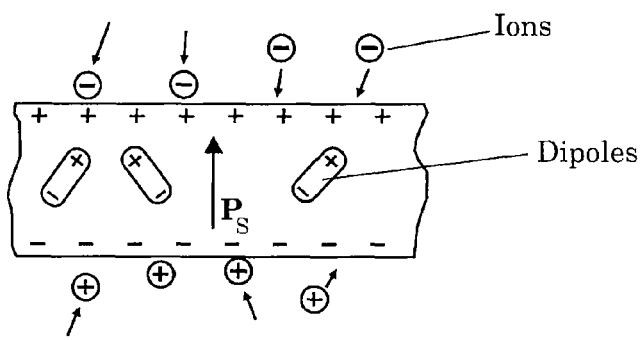
FIG. 1A is a schematic view of a traditional polarized pyroelectric dielectric material before introduction of capacitor electrodes.
Figure 1B:
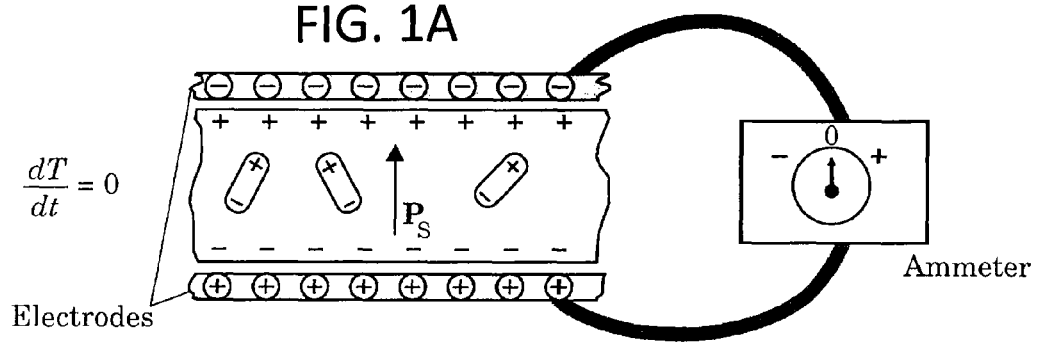
FIG. 1B shows a schematic view of a traditional quasi-isothermal pyroelectric energy generator when the pyroelectric material is made the dielectric in a capacitor and an ammeter is connected between the two capacitor electrodes, at constant temperature condition.
Figure 1C:
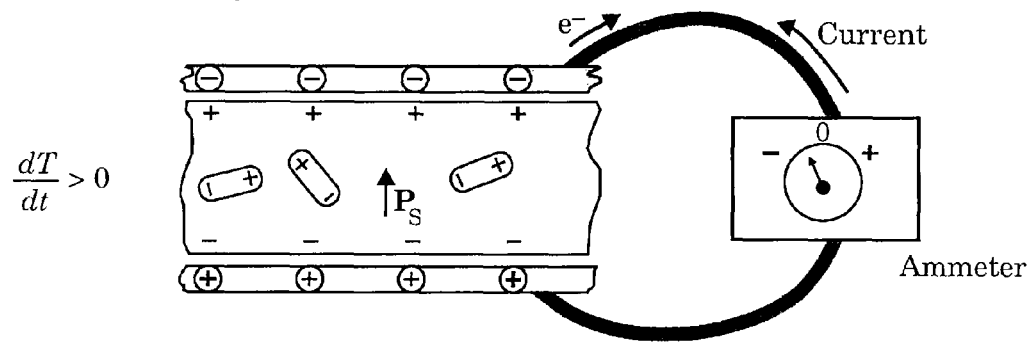
FIG. 1C shows a schematic view of a traditional pyroelectric energy generator generating electrical current when the pyroelectric material is made the dielectric in a capacitor and an ammeter is connected between the two capacitor electrodes, and the temperature is cycled.
Figure 2:
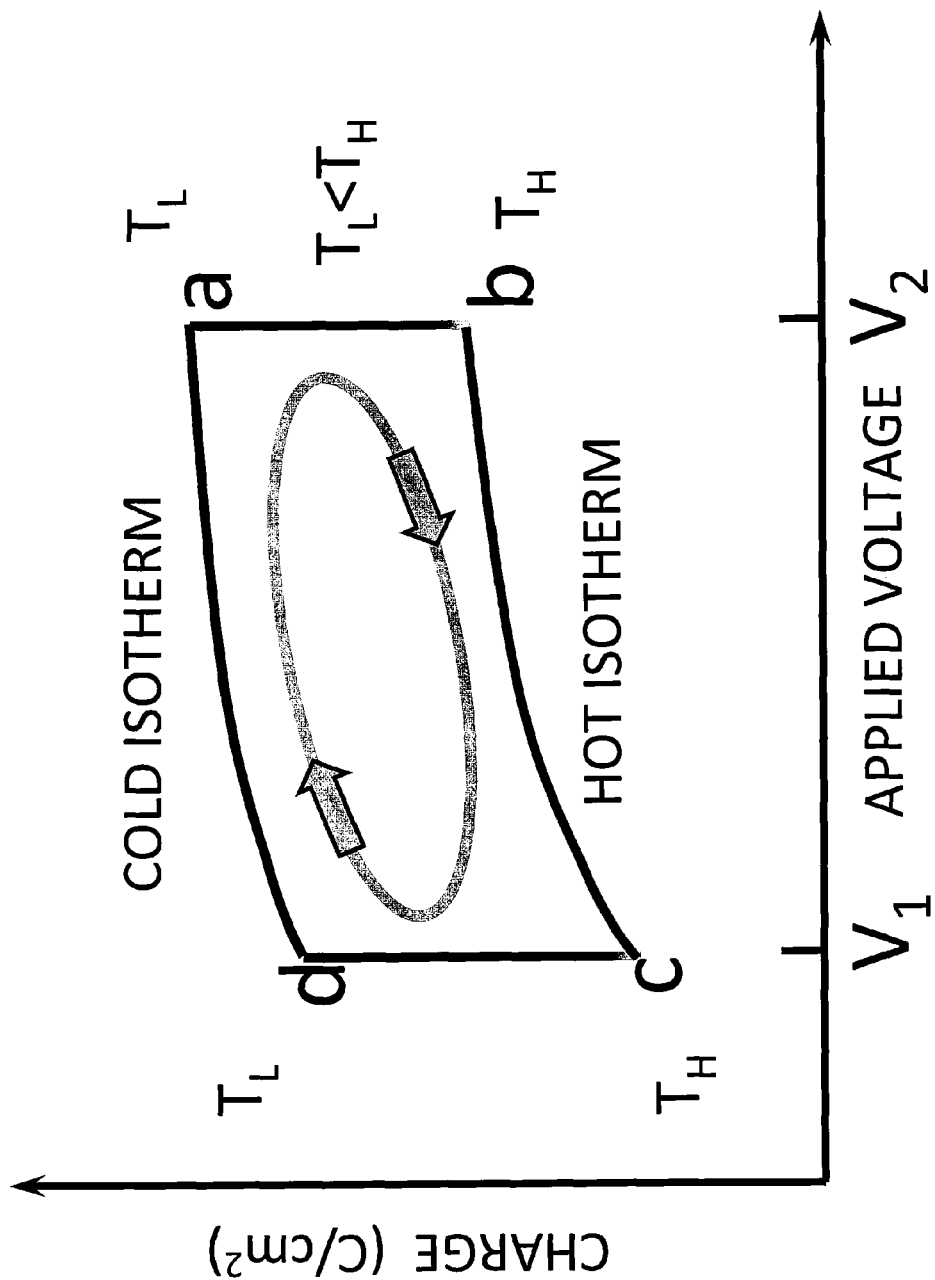
FIG. 2 shows an Ericson thermal energy generation cycle.
Figure 8:
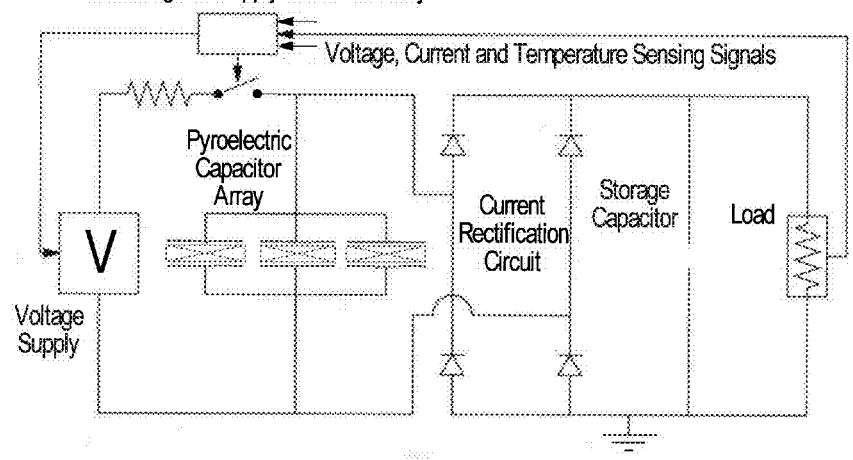
FIG. 8 shows a schematic circuit diagram of an array of cantilevered pyroelectric capacitors in an electrical energy generation circuit.

A pyroelectric capacitor switching, control and energy extraction circuit is shown schematically in FIG. 8. This circuit can be used to extract energy from individual cantilever pyroelectric capacitors or an array of capacitors as shown in FIG. 8. The circuit is preferably operated using an Ericson thermal engine cycle, as outlined in FIG. 2. A switching voltage supply provides the high and low voltages across the capacitors and is controlled by a switching circuit. This circuit, in turn, is controlled by the cantilever heating and cooling and current generation, and applies the appropriate voltages during the thermal energy extraction cycle. The current generated during the temperature cycling of the pyroelectric capacitors is rectified and stored in the storage capacitor.

A simplified timing diagram of the operation of this circuit is shown in FIG. 9A-9D. FIG. 9A shows the cantilever and pyroelectric capacitor temperature as the cantilever proof masses alternately contact the cold and hot surfaces through two complete cycles. The resulting change in the capacitance is shown in FIG. 9B—the capacitance increases as the temperature of the pyroelectric dielectric material drops, and inversely, decreases as the temperature is increased.

Figure 9:
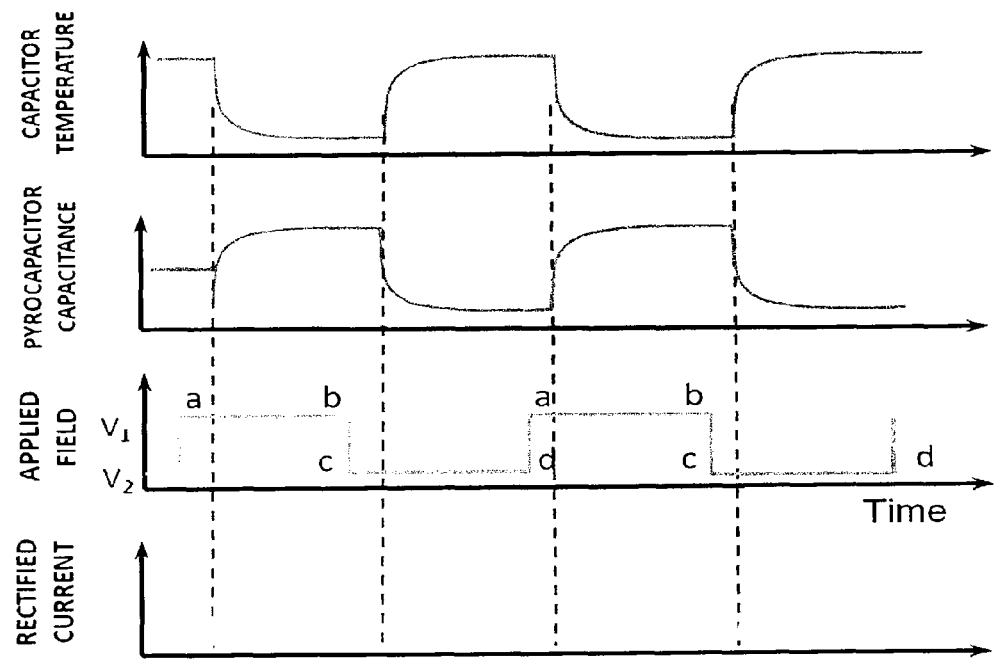
FIG. 9A shows a schematic of a voltage and temperature timing circuit for the temperature cycled pyroelectric capacitor modeled in FIG. 2 during two temperature cycles according to one preferred embodiment of this invention.
FIG. 9B shows a schematic of a pyrocapacitor capacitance during two cycles of a cantilevered pyroelectric capacitor according to one preferred embodiment of this invention.
FIG. 9C shows a timing schematic of an applied field during two cycles of a cantilevered pyroelectric capacitor according to one preferred embodiment of this invention.
FIG. 9D shows a timing schematic of a rectified current generated during two cycles of a cantilevered pyroelectric capacitor according to one preferred embodiment of this invention.

The curve in FIG. 9C shows the timing of the high and low voltages to the pyroelectric capacitor. The letters a-d refer to the points on the curve in FIG. 2 and show the voltages at the various stages during the electrical energy extraction cycle. Finally, the curve in FIG. 9D shows the rectified current extracted from the circuit during the thermal cycling. The application of the high and low voltages extracts current from the voltage supply (the transitions from d to a and b to c in FIGS. 2 and 9), but this current is recycled and is not lost. The major current pulses occur as the pyroelectric capacitor is rapidly heated or cooled.

The MEMS based pyroelectric power generators described herein operate at higher frequencies (100s of Hz to several kHz), use thinner film structures with lower thermal masses and comparatively higher dielectric strengths, and higher thermal conductivities (giving fast $\Delta T/\Delta t$ and hence large $\Delta Q/\Delta T$) than previous pyroelectric energy scavenging techniques. The use of the heat source to power the temperature cycling through the converter using bimaterial or bimetal heat sensitive structures, and use of resonant cantilever motion to rapidly move the converter through the temperature cycle leads to high efficiency operation (i.e. $W_P \approx 0$ in Equation 1). Encapsulating the generator in a partially evacuated enclosure also minimizes heat losses through convection and conduction processes (i.e. $Q_{Leak} \approx 0$ in Equation 1). Consequently, expected conversion efficiencies will be as high as 80-90% of the Carnot limit.

The energy conversion efficiency depends on the temperature difference between the hot and cold sources. For temperature differences in the range of 10-20° C., such as those found in cooling systems for supercomputer and data processing centers, overall efficiencies in the range of 3-7% are achievable. With higher temperature differences in the range of 100-300° C., such as those for computer microprocessors, internal combustion engines and steam power plants, overall efficiencies in the 20-40% range are achievable. These values are several times larger than those achievable with conventional thermal-to-electrical scavenging techniques.

These millimeter scale energy scavengers can readily be scaled to much larger devices by using arrays of individual converters. Arrays of up to $10^5$ converters can be fabricated, and these arrays themselves can be stacked to scavenge energy from much larger heat sources.

The present invention is described in further detail in connection with the following examples which illustrate or simulate various aspects involved in the practice of the invention. It is to be understood that the examples are included to assist in the understanding of this invention and are in no way limiting to the invention in its broad application. All changes that come within the spirit of the invention are desired to be protected and thus the invention is not to be construed as limited by these examples.

EXAMPLE 1

According to preliminary proof of concept testing, a traditional pyroelectric capacitor is fabricated from a polyvinylidene difluoride-trifluoroethylene copolymer (PVDF-TrFE or copolymer) based capacitor. This material includes a relatively high pyroelectric coefficient and dielectric strength and ease of fabrication using current wet chemical and wafer processing equipment and techniques.

According to this embodiment, the pyroelectric capacitors are preferably fabricated by sputtering Al electrodes onto each side of a 25 µm thick, electrically poled copolymer film. Electrical leads may be attached to the capacitor electrodes using silver based electrically conductive past. The measured capacitances for several of these thin film pyroelectric capacitors ranged from approximately 140 pF up to 1 nF. A 140 pF capacitor generates currents in the 10-15 nA range when exposed to changes in temperature of 15-20° C. Higher conversion efficiencies are achievable through adjustments in the fabrication techniques and materials.

EXAMPLE 2

According to further proof of concept testing, a pyroelectric capacitor test structure is fabricated from low thermal expansion $SiO_2$, higher thermal expansion Al, and much higher thermal expansion SU-8.

FIG. 10A-10G show a series of fabrication schematics starting with an Si bare wafer 200 in FIG. 10A. FIG. 10B shows a PE-CVD deposit $SiO_2$ thin film 210, resulting in $SiO_2$/Si layers. FIG. 10C shows an e-beam deposit of Al thin film 220 resulting in Al/$SiO_2$/Si layers. FIG. 10D represents a front side lithographic patterning of the structure. FIG. 10E shows an etching of the Al layer 220 and $SiO_2$ layer 210. FIGS. 10F and 10G show backside photolithographic patterning and backside etching of the Si layer 200 to release the biomorphic cantilever structure, respectively.

The above construction technique is illustrative and is particularly suited to fabrication of test structures and may be adjusted depending on the desired pyroelectric capacitor materials and configuration.

EXAMPLE 3

According to one preferred embodiment, the fabrication steps leading to the fabrication of a cantilevered pyroelectric capacitive device based on the pyroelectric material aluminum nitride (AlN) is shown schematically in FIG. 11A-H. The AlN material has a lower pyroelectric coefficient than that of the PVDF-TrFE copolymer, but is easier to fabricate into cantilever structures using available processing equipment. A base 100 mm Si wafer 200 is shown in FIG. 11A. The first step in the fabrication of the cantilever structure according to this embodiment uses a 10 µm thick PECVD deposited silicon dioxide layer 260, as shown in FIG. 11B.

FIG. 11C shows the first photolithography step wherein a 100 nm titanium (Ti) layer 270 is deposited and patterned, and acts as the bottom electrode of the capacitor. Next, as shown in FIG. 11D, the AlN dielectric layer 280 is deposited. FIG. 11E shows the subsequent second photolithography step where the top Ti capacitor electrode layer 290 is deposited and patterned. FIG. 11F shows a schematic of the deposition of a SU-8 polymer layer, for example through spin coating, and which acts as the high thermal expansion layer in the cantilever structure. FIG. 11G shows the structure following a third photolithography step and RIE etching to access bottom electrodes. FIG. 11H shows the structure following $4^{th}$ and $5^{th}$ photolithography steps including RIE of the SU-8, AlN and SiOx layers to pattern the cantilever structure and a back side through-wafer etch to release the cantilever.

The resulting structure in FIG. 11H includes a base Si layer 200 followed by a 10 µm PECVD LS SiOx layer 260, a 100 nm Ti layer 270, a 100 nm AlN layer 280, a second 100 nm Ti layer 290 and a 1-10 µm SU-8 layer. The above construction technique is illustrative and may be adjusted depending on the desired pyroelectric capacitor materials and configuration.

The optimal dimensions for each pyroelectric energy converter cell in the above example are in the range from approximately 100 µm to approximately 10 mm in length, approximately 50 µm to approximately 5 mm in width and approximately 1 µm to approximately 1 mm in thickness. The approximate thickness for the individual layers is as follows: the Ti bottom electrode—approximately 10 nm to approximately 100 nm, the Ti bimetal top electrode—approximately 0.1 µm to approximately 100 µm, the pyroelectric dielectric layer (for example, AlN, PVDF, DVDF-TrFE)=approximately 0.5 μm to approximately 1 mm. The thicknesses of the $SiO_2$ and SU8 layers are adjustable to optimize the bending response of the cantilever structure and to optimize the thermal responsivity of the cantilevered pyroelectric capacitor structure.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A pyroelectric thermal energy harvesting apparatus for generating an electric current comprising:
    a first surface having a first temperature (TH);
    a second surface spaced apart from the first surface, the second surface having a second temperature (TL) that is less the first temperature (TH) resulting in a temperature difference between the first surface and the second surface;
    a layered capacitor disposed between the first surface and the second surface, the capacitor having,
    a conductive, bimetal top electrode layer cantilevered from one of the first surface and the second surface by an anchor,
    a conductive bottom electrode layer facing the second surface,
    a pyroelectric dielectric layer sandwiched between the top and bottom electrodes;
    a pair of proof masses, one proof mass affixed to each electrode layer and each facing one of the first surface and the second surface; and
    wherein the temperature difference between the first surface and the second surface causes the layered capacitor to deform by differential thermal expansion between the top electrode layer and the dielectric layer, causing the proof masses to alternately contact the first and second surfaces at the resonant frequency of the layered capacitor such that a pyroelectric current is generated between the electrodes.

2. The pyroelectric thermal energy harvesting apparatus of claim 1 wherein the capacitor includes a length and a width, the length at least four times as long as the width.

3. The pyroelectric thermal energy harvesting apparatus of claim 2 wherein the capacitor further includes a thickness less than half of the width.

4. The pyroelectric thermal energy harvesting apparatus of claim 1 wherein the proof masses are each affixed to opposite sides of a distal end of the capacitor.

5. The pyroelectric thermal energy harvesting apparatus of claim 1 further comprising an external circuitry connected to the electrodes with a low thermal conductivity material.

6. The pyroelectric thermal energy harvesting apparatus of claim 5 further comprising a top electrode anchor and a bottom electrode anchor separated by a space in the layered capacitor.

7. The pyroelectric thermal energy harvesting apparatus of claim 1 wherein the bottom electrode layer is thinner than the top electrode layer.

8. The pyroelectric thermal energy harvesting apparatus of claim 1 wherein the pyroelectric dielectric layer comprises at least one of polyvinylidene fluoride (PVDF), PVDF-TrFE, and aluminum nitride.

9. The pyroelectric thermal energy harvesting apparatus of claim 1 wherein the top electrode comprises a different material from the bottom electrode.

10. The pyroelectric thermal energy harvesting apparatus of claim 1 wherein the top electrode comprises titanium (Ti) and the bottom electrode comprises at least one of gold (Au) and aluminum (Al).

11. A pyroelectric thermal energy harvesting apparatus for generating an electric current comprising:
    an elongated, layered capacitor extending between a first surface and a second surface, the first surface having a temperature difference from the second surface, the layered capacitor having a proximal end anchored to the first surface and an opposite distal end, the layered capacitor including a conductive, bimetal top electrode layer, an intermediate pyroelectric dielectric layer and a conductive bottom electrode layer, wherein the layered capacitor oscillates between and makes contact with the first surface and the second surface such that a temperature change is induced in the layered capacitor thereby generating a current when the layered capacitor is connected to an external circuit; and
    a pair of proof masses, each proof mass affixed to each electrode layer at the distal end of the capacitor to face one of the first surface and the second surface, wherein the proof masses oscillate between and make contact with the first surface and the second surface.

12. The pyroelectric thermal energy harvesting apparatus of claim 11 wherein the proof masses comprise a highly thermal conductive material to maximize heat transfer from the first surface and the second surface.

13. The pyroelectric thermal energy harvesting apparatus of claim 12 wherein the proof masses comprise one of gold (Au), graphene thin film, and a diamond-like thin film surface.

14. The pyroelectric thermal energy apparatus of claim 11 further comprising:
    a top electrode anchor and a bottom electrode anchor positioned at the proximal end of the layered capacitor, the top electrode anchor split from the bottom electrode anchor.

15. The pyroelectric thermal energy harvesting apparatus of claim 11 wherein the proof masses oscillate at a frequency between 10 Hz and 1 kHz.

16. The pyroelectric thermal energy harvesting apparatus of claim 11 wherein the bottom electrode layer is substantially thinner than the top electrode layer.

17. The pyroelectric thermal energy harvesting apparatus of claim 11 wherein the pyroelectric dielectric layer comprises at least one of polyvinylidene fluoride (PVDF), PVDF-TrFE, and aluminum nitride.

18. A method of generating an electric current from a pyroelectric thermal energy harvesting apparatus comprising the steps of:
    a) providing a thermal energy source including,
        a first surface having a first temperature (TH),
        a second surface having a second temperature (TL) that is less than the first temperature (TH), the second surface being spaced apart from the first surface,
        a layered capacitor disposed between the first surface and the second surface, the capacitor having,
        a conductive, bimetal top electrode layer cantilevered from the first surface by an anchor,
        a conductive bottom electrode layer facing the second surface,
        a pyroelectric dielectric layer sandwiched between the top and bottom electrodes,
        a pair of proof masses, one proof mass affixed to each electrode layer and each facing one of the first surface and the second surface;

b) alternately deforming the bimetal top electrode with the temperature gradient between the first temperature (TH) and the second temperature (TL), such that the proof masses alternately contact the first surface and the second surface at the resonant frequency of the layered capacitor; and c) placing an electric load between the top electrode and the bottom electrode.

19. The method of claim 18 further comprising:
providing external circuitry for energy extraction; and
electrically connecting the top electrode with the external circuitry through the anchor.

20. The method of claim 18 further comprising:
providing an array of layered capacitors along the first surface.

21. The method of claim 18 further comprising:
operating the layered capacitor at a frequency greater than 10 Hz.

22. The method of claim 18 further comprising:
isolating the layered capacitor within a partially evacuated enclosure.

\* \* \* \* \*